(12) United States Patent
Hayes et al.

(10) Patent No.: US 9,563,506 B2
(45) Date of Patent: Feb. 7, 2017

(54) STORAGE CLUSTER

(71) Applicant: Pure Storage, Inc., Mountain View, CA (US)

(72) Inventors: John Hayes, Mountain View, CA (US); John Colgrove, Mountain View, CA (US); Robert Lee, Mountain View, CA (US); Peter Vajgel, Mountain View, CA (US); Par Botes, Mountain View, CA (US)

(73) Assignee: Pure Storage, Inc., Mountain View, CA (US)

( * ) Notice: Subject to any disclaimer, the term of this patent is extended or adjusted under 35 U.S.C. 154(b) by 290 days.

(21) Appl. No.: 14/491,552

(22) Filed: Sep. 19, 2014

(65) Prior Publication Data

US 2015/0355969 A1    Dec. 10, 2015

Related U.S. Application Data

(63) Continuation of application No. 14/296,151, filed on Jun. 4, 2014, now Pat. No. 8,850,108.

(51) Int. Cl.
*G06F 11/10* (2006.01)
*G06F 12/02* (2006.01)
(Continued)

(52) U.S. Cl.
CPC ............. *G06F 11/1076* (2013.01); *G06F 3/06* (2013.01); *G06F 3/0613* (2013.01);
(Continued)

(58) Field of Classification Search
CPC ...... G06F 11/1076; G06F 3/06; G06F 3/0613; G06F 3/0655; G06F 3/0688; G06F 11/1068; G06F 11/1092; G06F 12/0246; H03M 13/154
(Continued)

(56) References Cited

U.S. PATENT DOCUMENTS 5,390,327 A   2/1995   Lubbers et al.
5,479,653 A   12/1995  Jones
(Continued)

FOREIGN PATENT DOCUMENTS

| EP | 2164006 | 3/2010 |
|---|---|---|
| WO | WO 02-13033 | 2/2002 |
| WO | WO 2008103569 | 8/2008 |

OTHER PUBLICATIONS

Notification of Transmittal of the International Search Report and the Written Opinion of the International Searching Authority, PCT/US2015/018169, mailed May 15, 2015, pp. 1-12.
(Continued)

*Primary Examiner* — Stephen Elmore
(74) *Attorney, Agent, or Firm* — Womble Carlyle Sandridge & Rice LLP

(57) ABSTRACT

A plurality of storage nodes is provided. The plurality of storage nodes is configured to communicate together as a storage cluster. Each of the plurality of storage nodes includes nonvolatile solid-state memory. The plurality of storage nodes is configured to distribute user data and metadata associated with the user data throughout the plurality of storage nodes such that the plurality of storage nodes maintain the ability to read the user data, using erasure coding, despite a loss of one of the plurality of storage nodes. A chassis enclosing the plurality of storage nodes includes power distribution, a high speed communication bus and the ability to install one or more storage nodes which may use the power distribution and communication bus in some embodiments. A method for accessing user data in a plurality of storage nodes having nonvolatile solid-state memory is also provided.

20 Claims, 6 Drawing Sheets

(51) Int. Cl.
*G06F 3/06* (2006.01)
*H03M 13/15* (2006.01)

(52) U.S. Cl.
CPC ......... *G06F 3/0655* (2013.01); *G06F 3/0688* (2013.01); *G06F 11/1068* (2013.01); *G06F 11/1092* (2013.01); *G06F 12/0246* (2013.01); *H03M 13/154* (2013.01); *G06F 11/108* (2013.01); *G06F 2201/845* (2013.01); *G06F 2212/7206* (2013.01); *G06F 2212/7207* (2013.01)

(58) Field of Classification Search
USPC ........ 711/103, 154, 156, 158, 170; 713/340; 714/6.2, 6.24, 6.32
See application file for complete search history.

(56) References Cited

U.S. PATENT DOCUMENTS

| | | |
|---|---|---|
| 5,649,093 A | 7/1997 | Hanko et al. |
| 6,275,898 B1 | 8/2001 | DeKoning |
| 6,643,748 B1 | 11/2003 | Wieland |
| 6,725,392 B1* | 4/2004 | Frey .................. G06F 11/1076 714/15 |
| 6,985,995 B2 | 1/2006 | Holland et al. |
| 7,069,383 B2 | 6/2006 | Yamamoto et al. |
| 7,076,606 B2 | 7/2006 | Orsley |
| 7,107,480 B1 | 9/2006 | Moshayedi et al. |
| 7,159,150 B2 | 1/2007 | Kenchammana-Hosekote |
| 7,162,575 B2 | 1/2007 | Dalal et al. |
| 7,334,156 B2 | 2/2008 | Land et al. |
| 7,370,220 B1 | 5/2008 | Nguyen et al. |
| 7,444,532 B2 | 10/2008 | Masuyama et al. |
| 7,480,658 B2 | 1/2009 | Heinla et al. |
| 7,558,859 B2 | 7/2009 | Kasiolas |
| 7,613,947 B1 | 11/2009 | Coatney |
| 7,681,104 B1 | 3/2010 | Sim-Tang et al. |
| 7,681,105 B1 | 3/2010 | Sim-Tang et al. |
| 7,730,258 B1 | 6/2010 | Smith |
| 7,743,276 B2 | 6/2010 | Jacobson et al. |
| 7,757,038 B2 | 7/2010 | Kitahara |
| 7,778,960 B1* | 8/2010 | Chatterjee ............. G06F 17/303 707/609 |
| 7,814,272 B2 | 10/2010 | Barrall et al. |
| 7,814,273 B2 | 10/2010 | Barrall |
| 7,818,531 B2 | 10/2010 | Barrall |
| 7,827,351 B2 | 11/2010 | Suetsugu et al. |
| 7,827,439 B2 | 11/2010 | Matthew et al. |
| 7,870,105 B2 | 1/2011 | Arakawa et al. |
| 7,885,938 B1 | 2/2011 | Greene et al. |
| 7,886,111 B2 | 2/2011 | Klemm et al. |
| 7,908,448 B1* | 3/2011 | Chatterjee ........... G06F 11/2064 707/655 |
| 7,941,697 B2 | 5/2011 | Mathew et al. |
| 7,958,303 B2 | 6/2011 | Shuster |
| 7,971,129 B2 | 6/2011 | Watson |
| 8,010,485 B1* | 8/2011 | Chatterjee ................ G06F 3/061 707/609 |
| 8,010,829 B1* | 8/2011 | Chatterjee ........... G06F 11/2061 714/4.11 |
| 8,020,047 B2 | 9/2011 | Courtney |
| 8,046,548 B1* | 10/2011 | Chatterjee ........... G06F 11/2064 707/655 |
| 8,051,361 B2 | 11/2011 | Sim-Tang et al. |
| 8,051,362 B2 | 11/2011 | Li et al. |
| 8,082,393 B2 | 12/2011 | Galloway et al. |
| 8,086,634 B2 | 12/2011 | Mimatsu |
| 8,086,911 B1 | 12/2011 | Taylor |
| 8,108,502 B2 | 1/2012 | Tabbara et al. |
| 8,117,388 B2 | 2/2012 | Jernigan, IV |
| 8,145,838 B1* | 3/2012 | Miller .................. G06F 11/2023 711/114 |
| 8,145,840 B2 | 3/2012 | Koul et al. |
| 8,176,360 B2 | 5/2012 | Frost et al. |
| 8,244,999 B1 | 8/2012 | Chatterjee et al. |
| 8,305,811 B2 | 11/2012 | Jeon |
| 8,315,999 B2 | 11/2012 | Chatley et al. |
| 8,327,080 B1* | 12/2012 | Der ..................... G06F 12/0804 711/141 |
| 8,402,152 B2 | 3/2013 | Duran |
| 8,412,880 B2 | 4/2013 | Leibowitz et al. |
| 8,473,778 B2 | 6/2013 | Simitci |
| 8,479,037 B1 | 7/2013 | Chatterjee et al. |
| 8,498,967 B1* | 7/2013 | Chatterjee ......... G06F 17/30174 707/639 |
| 8,522,073 B2* | 8/2013 | Cohen ................. G06F 11/1662 714/4.11 |
| 8,533,527 B2 | 9/2013 | Daikokuya et al. |
| 8,595,455 B2 | 11/2013 | Chatterjee et al. |
| 8,615,599 B1 | 12/2013 | Takefman et al. |
| 8,627,136 B2 | 1/2014 | Shankar et al. |
| 8,627,138 B1 | 1/2014 | Clark |
| 8,660,131 B2 | 2/2014 | Vermunt et al. |
| 8,700,875 B1* | 4/2014 | Barron .................. G06F 3/0605 711/170 |
| 8,713,405 B2 | 4/2014 | Healey et al. |
| 8,762,793 B2 | 6/2014 | Grube et al. |
| 8,775,858 B2 | 7/2014 | Gower et al. |
| 8,775,868 B2 | 7/2014 | Colgrove et al. |
| 8,788,913 B1 | 7/2014 | Xin et al. |
| 8,799,746 B2 | 8/2014 | Baker et al. |
| 8,819,383 B1 | 8/2014 | Jobanputra et al. |
| 8,824,261 B1 | 9/2014 | Miller et al. |
| 8,843,700 B1 | 9/2014 | Salessi et al. |
| 8,850,108 B1 | 9/2014 | Hayes et al. |
| 8,850,288 B1 | 9/2014 | Lazier et al. |
| 8,856,593 B2 | 10/2014 | Eckhardt et al. |
| 8,856,619 B1 | 10/2014 | Cypher |
| 8,862,847 B2 | 10/2014 | Feng et al. |
| 8,868,825 B1 | 10/2014 | Hayes |
| 8,874,836 B1 | 10/2014 | Hayes |
| 8,898,383 B2 | 11/2014 | Yamamoto et al. |
| 8,898,388 B1 | 11/2014 | Kimmel |
| 8,918,478 B2 | 12/2014 | Ozzie et al. |
| 8,929,066 B2 | 1/2015 | Herman |
| 9,021,053 B2 | 4/2015 | Bernbo et al. |
| 9,025,393 B2 | 5/2015 | Wu |
| 9,053,808 B2 | 6/2015 | Sprouse |
| 9,058,155 B2 | 6/2015 | Cepulis et al. |
| 9,116,819 B2 | 8/2015 | Cope et al. |
| 9,117,536 B2 | 8/2015 | Yoon |
| 9,201,733 B2 | 12/2015 | Verma |
| 9,207,876 B2 | 12/2015 | Shu et al. |
| 9,384,082 B1 | 7/2016 | Lee et al. |
| 9,405,478 B2 | 8/2016 | Koseki et al. |
| 9,432,541 B2 | 8/2016 | Ishida |
| 9,477,632 B2 | 10/2016 | Du |
| 2003/0105984 A1 | 6/2003 | Masuyama et al. |
| 2004/0161086 A1 | 8/2004 | Buntin et al. |
| 2005/0001652 A1 | 1/2005 | Malik et al. |
| 2005/0076228 A1 | 4/2005 | Davis et al. |
| 2005/0283649 A1 | 12/2005 | Turner et al. |
| 2006/0114930 A1 | 6/2006 | Lucas et al. |
| 2006/0174157 A1 | 8/2006 | Barrall et al. |
| 2007/0079068 A1 | 4/2007 | Draggon |
| 2007/0214194 A1 | 9/2007 | Reuter |
| 2007/0214314 A1 | 9/2007 | Reuter |
| 2007/0234016 A1 | 10/2007 | Davis et al. |
| 2007/0268905 A1 | 11/2007 | Baker et al. |
| 2008/0080709 A1 | 4/2008 | Michtchenko et al. |
| 2008/0107274 A1 | 5/2008 | Worthy |
| 2008/0155191 A1 | 6/2008 | Anderson et al. |
| 2008/0295118 A1* | 11/2008 | Liao ........................ G06F 9/544 719/328 |
| 2009/0216920 A1 | 8/2009 | Lauterbach et al. |
| 2010/0042636 A1 | 2/2010 | Lu |
| 2010/0115070 A1 | 5/2010 | Missimilly |
| 2010/0169707 A1 | 7/2010 | Mathew et al. |
| 2010/0174576 A1 | 7/2010 | Naylor |
| 2010/0268908 A1* | 10/2010 | Ouyang ............ G06F 11/2094 711/170 |
| 2011/0302369 A1 | 12/2011 | Goto et al. |

(56) References Cited

U.S. PATENT DOCUMENTS

| | | | |
|---|---|---|---|
| 2012/0166886 A1* | 6/2012 | Shankar | G06F 11/2028 714/43 |
| 2012/0198152 A1 | 8/2012 | Terry et al. | |
| 2012/0198261 A1 | 8/2012 | Brown et al. | |
| 2012/0209943 A1 | 8/2012 | Jung | |
| 2012/0226934 A1 | 9/2012 | Rao | |
| 2012/0311557 A1 | 12/2012 | Resch | |
| 2013/0022201 A1 | 1/2013 | Glew et al. | |
| 2013/0036314 A1 | 2/2013 | Glew et al. | |
| 2013/0060884 A1* | 3/2013 | Bernbo | G06F 17/30212 709/216 |
| 2013/0067188 A1 | 3/2013 | Mehra et al. | |
| 2013/0073894 A1* | 3/2013 | Xavier | G06F 11/2092 714/4.2 |
| 2013/0124776 A1 | 5/2013 | Hallak et al. | |
| 2013/0151653 A1 | 6/2013 | Sawicki et al. | |
| 2013/0151771 A1 | 6/2013 | Tsukahara et al. | |
| 2013/0238554 A1 | 9/2013 | Yucel et al. | |
| 2013/0339314 A1 | 12/2013 | Carpenter et al. | |
| 2013/0339818 A1 | 12/2013 | Baker et al. | |
| 2014/0040702 A1 | 2/2014 | He et al. | |
| 2014/0047263 A1* | 2/2014 | Coatney | G06F 11/2023 714/4.11 |
| 2014/0052706 A1* | 2/2014 | Misra | G06F 17/30073 707/698 |
| 2014/0063721 A1 | 3/2014 | Herman et al. | |
| 2014/0064048 A1 | 3/2014 | Cohen et al. | |
| 2014/0068224 A1 | 3/2014 | Fan et al. | |
| 2014/0136880 A1 | 5/2014 | Shankar et al. | |
| 2014/0279936 A1 | 9/2014 | Bernbo et al. | |
| 2014/0380125 A1 | 12/2014 | Calder et al. | |
| 2014/0380126 A1 | 12/2014 | Yekhanin et al. | |
| 2015/0089283 A1 | 3/2015 | Kermarrec et al. | |
| 2015/0134824 A1 | 5/2015 | Mickens et al. | |
| 2015/0153800 A1 | 6/2015 | Lucas et al. | |
| 2015/0280959 A1 | 10/2015 | Vincent | |

OTHER PUBLICATIONS

International Search Report and the Written Opinion of the International Searching Authority, PCT/US2015/034302, mailed Sep. 11, 2015, pp. 1-12.

Schmid, Patrick; "RAID Scaling Charts, Part 3: 4-128 kB Stripes Compared", Tom's Hardware, Nov. 27, 2007 (http://www.tomshardware.com/reviews/RAID-SCALING-CHARTS.1735-4.html), See pp. 1-2.

International Search Report, PCT/US2015/034291, mailed Sep. 30, 2015, pp. 1-3.

International Search Report, PCT/US2015/044370, mailed Dec. 15, 2015, pp. 1-3.

International Search Report, PCT/US2016/014604, mailed May 19, 2016, pp. 1-3.

Notification of Transmittal of the International Search Report and the Written Opinion of the International Searching Authority, PCT/US2015/018169, mailed May 15, 2015.

Storer, Mark W., Greenan, Kevin M., Miller L. Ethan, Voruganti, Kaladhar; Pergamum: Replacing Tape with Energy Efficient, Reliable, Disk-Based Archival Storage.

Hwang, Kai, Jin, Hai, Ho, Roy; RAID-x: A New Distributed Disk Array for I/O-Centric Cluster Computing.

* cited by examiner

STORAGE CLUSTER

BACKGROUND

Solid-state memory, such as flash, is currently in use in solid-state drives (SSD) to augment or replace conventional hard disk drives (HDD), writable CD (compact disk) or writable DVD (digital versatile disk) drives, collectively known as spinning media, and tape drives, for storage of large amounts of data. Flash and other solid-state memories have characteristics that differ from spinning media. Yet, many solid-state drives are designed to conform to hard disk drive standards for compatibility reasons, which makes it difficult to provide enhanced features or take advantage of unique aspects of flash and other solid-state memory.

It is within this context that the embodiments arise.

SUMMARY

In some embodiments, a plurality of storage nodes is provided. The plurality of storage nodes is configured to communicate together as a storage cluster. Each of the plurality of storage nodes includes nonvolatile solid-state memory. The plurality of storage nodes is configured to distribute user data and metadata associated with the user data throughout the plurality of storage nodes such that the plurality of storage nodes maintain the ability to read the user data, using erasure coding, despite a loss of one of the plurality of storage nodes. In some embodiments, the plurality of storage nodes is housed within a single chassis. The chassis includes power distribution, a high speed communication bus and the ability to install one or more storage nodes which may use the power distribution and communication bus. A method for accessing user data in a plurality of storage nodes having nonvolatile solid-state memory is also provided.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
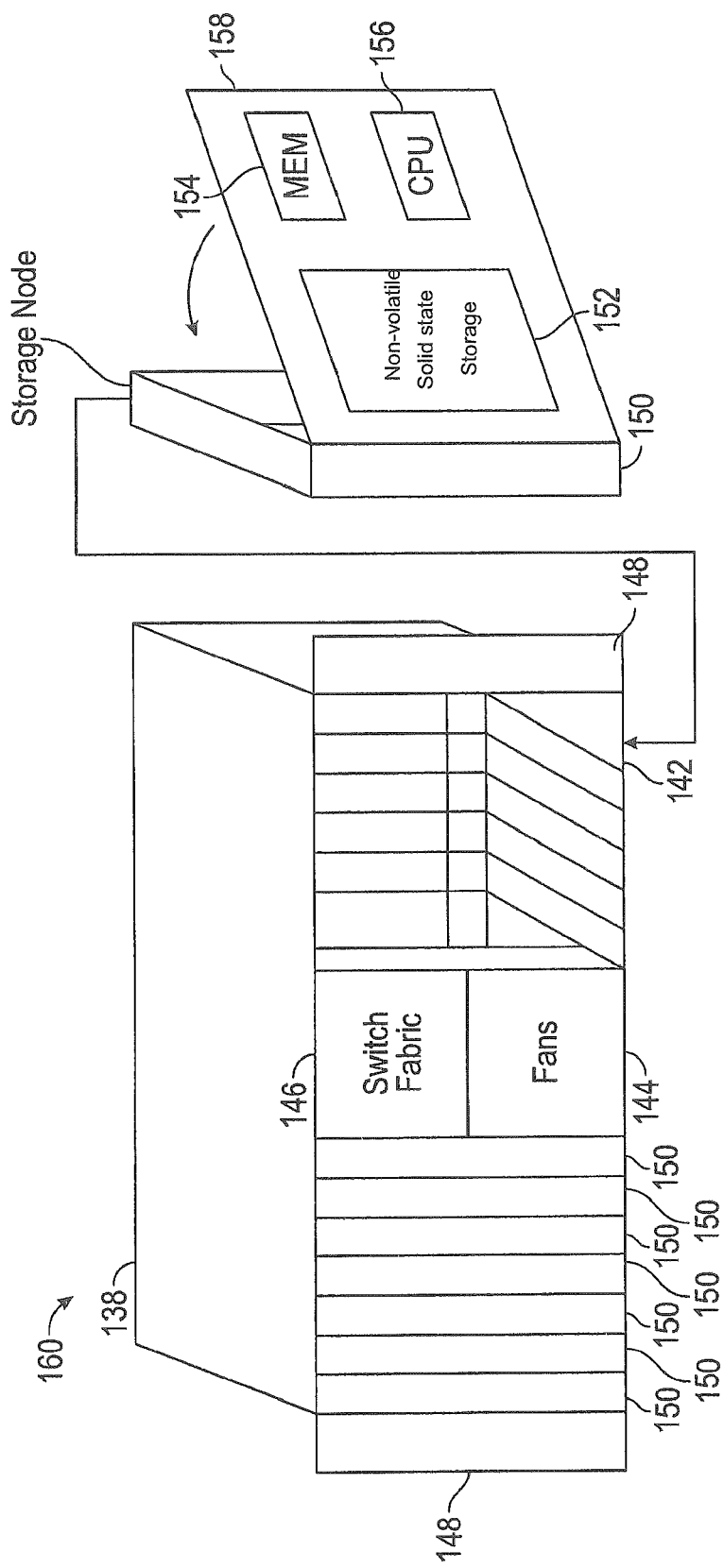
FIG. 1 is a perspective view of a storage cluster with multiple storage nodes and internal storage coupled to each storage node to provide network attached storage, in accordance with some embodiments.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid state memory units, which may be referred to as storage units. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Figure 2:
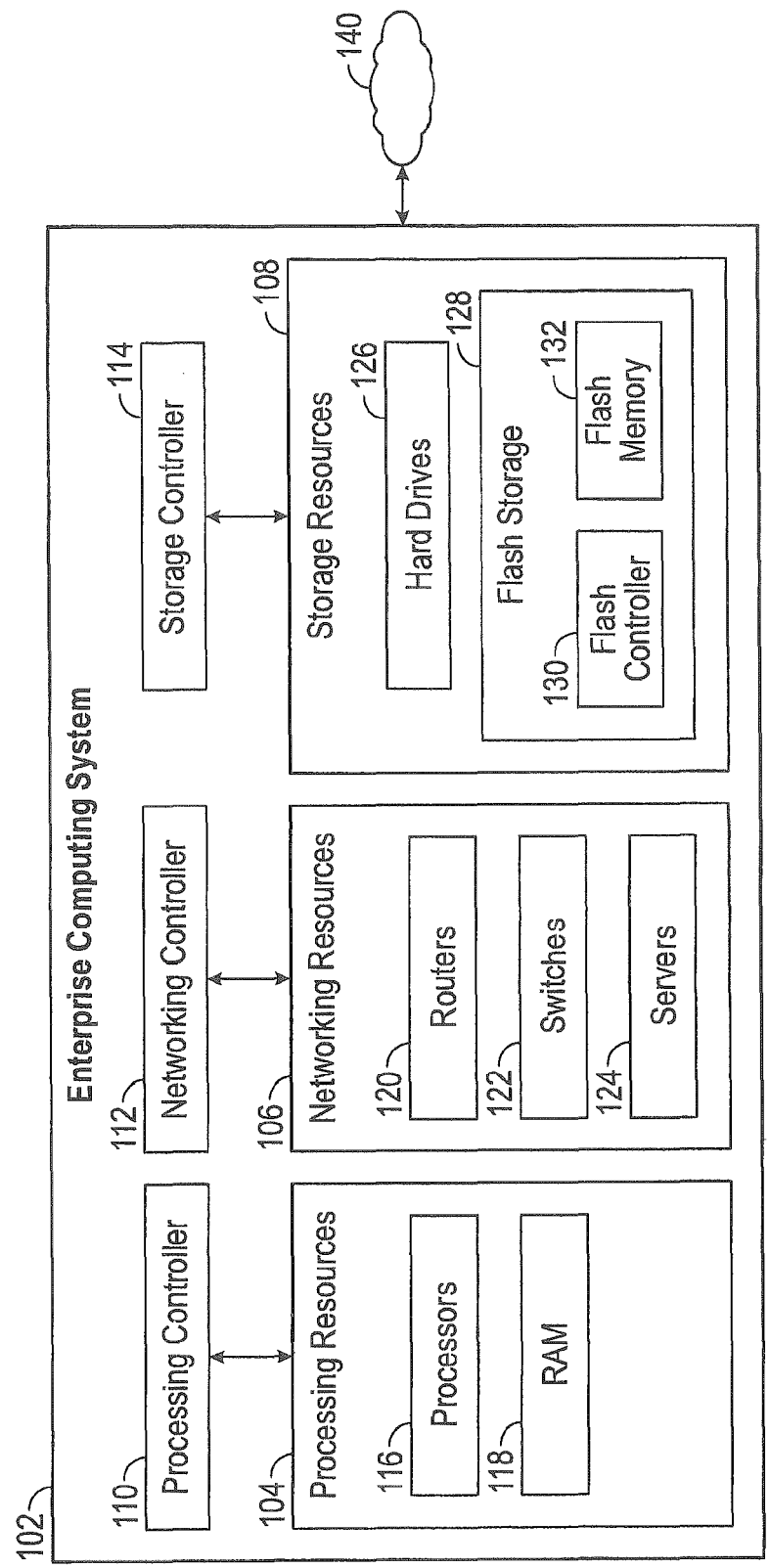
FIG. 2 is a system diagram of an enterprise computing system, which can use one or more of the storage clusters of FIG. 1 as a storage resource in some embodiments.

FIG. 2 is a system diagram of an enterprise computing system 102, which can use one or more of the storage nodes, storage clusters and/or non-volatile solid state storage of FIG. 1 as a storage resource 108. For example, flash storage 128 of FIG. 2 may integrate the storage nodes, storage clusters and/or non-volatile solid state storage of FIG. 1 in some embodiments. The enterprise computing system 102 has processing resources 104, networking resources 106 and storage resources 108, including flash storage 128. A flash controller 130 and flash memory 132 are included in the flash storage 128. In various embodiments, the flash storage 128 could include one or more storage nodes or storage clusters, with the flash controller 130 including the CPUs, and the flash memory 132 including the non-volatile solid state storage of the storage nodes. In some embodiments flash memory 132 may include different types of flash memory or the same type of flash memory. The enterprise computing system 102 illustrates an environment suitable for deployment of the flash storage 128, although the flash storage 128 could be used in other computing systems or devices, larger or smaller, or in variations of the enterprise computing system 102, with fewer or additional resources.

The enterprise computing system 102 can be coupled to a network 140, such as the Internet, in order to provide or make use of services. For example, the enterprise computing system 102 could provide cloud services, physical computing resources, or virtual computing services.

In the enterprise computing system 102, various resources are arranged and managed by various controllers. A processing controller 110 manages the processing resources 104, which include processors 116 and random-access memory (RAM) 118. Networking controller 112 manages the networking resources 106, which include routers 120, switches 122, and servers 124. A storage controller 114 manages storage resources 108, which include hard drives 126 and flash storage 128. Other types of processing resources, networking resources, and storage resources could be included with the embodiments. In some embodiments, the flash storage 128 completely replaces the hard drives 126. The enterprise computing system 102 can provide or allocate the various resources as physical computing resources, or in variations, as virtual computing resources supported by physical computing resources. For example, the various resources could be implemented using one or more servers executing software. Files or data objects, or other forms of data, are stored in the storage resources 108.

In various embodiments, an enterprise computing system 102 could include multiple racks populated by storage clusters, and these could be located in a single physical location such as in a cluster or a server farm. In other embodiments the multiple racks could be located at multiple physical locations such as in various cities, states or countries, connected by a network. Each of the racks, each of the storage clusters, each of the storage nodes, and each of the non-volatile solid state storage could be individually configured with a respective amount of storage space, which is then reconfigurable independently of the others. Storage capacity can thus be flexibly added, upgraded, subtracted, recovered and/or reconfigured at each of the non-volatile solid state storages. As mentioned previously, each storage node could implement one or more servers in some embodiments.

Figure 3:
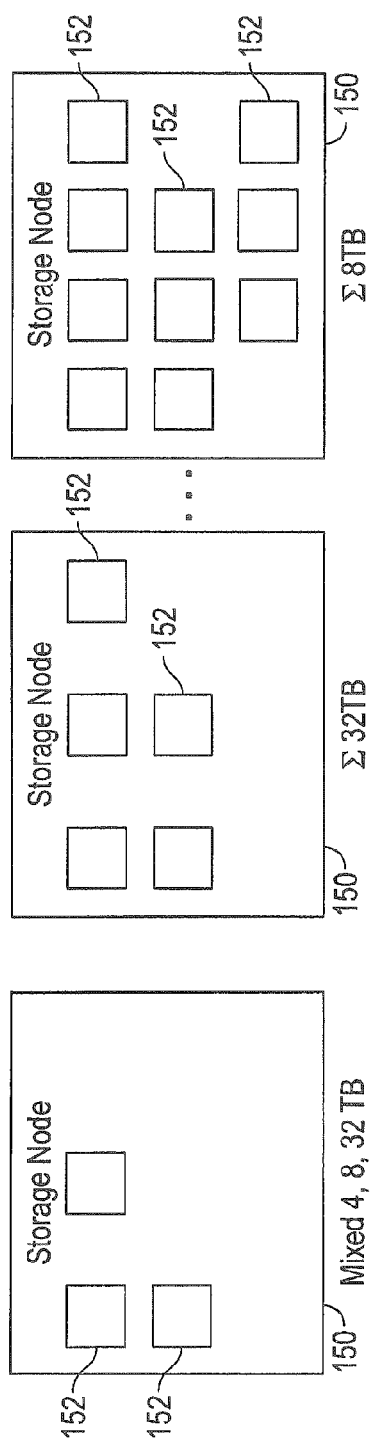
FIG. 3 is a block diagram showing multiple storage nodes and non-volatile solid state storage with differing capacities, suitable for use in the storage cluster of FIG. 1 in accordance with some embodiments.

FIG. 3 is a block diagram showing multiple storage nodes 150 and non-volatile solid state storage 152 with differing capacities, suitable for use in the chassis of FIG. 1. Each storage node 150 can have one or more units of non-volatile solid state storage 152. Each non-volatile solid state storage 152 may include differing capacity from other non-volatile solid state storage 152 on a storage node 150 or in other storage nodes 150 in some embodiments. Alternatively, all of the non-volatile solid state storages 152 on a storage node or on multiple storage nodes can have the same capacity or combinations of the same and/or differing capacities. This flexibility is illustrated in FIG. 3, which shows an example of one storage node 150 having mixed non-volatile solid state storage 152 of four, eight and thirty-two TB capacity, another storage node 150 having non-volatile solid state storage 152 each of thirty-two TB capacity, and still another storage node having non-volatile solid state storage 152 each of eight TB capacity. Various further combinations and capacities are readily devised in accordance with the teachings herein. In the context of clustering, e.g., clustering storage to form a storage cluster, a storage node can be or include a non-volatile solid state storage 152. Non-volatile solid state storage 152 is a convenient clustering point as the non-volatile solid state storage 152 may include a nonvolatile random access memory (NVRAM) component, as will be further described below.

Referring to FIGS. 1 and 3, storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 4:
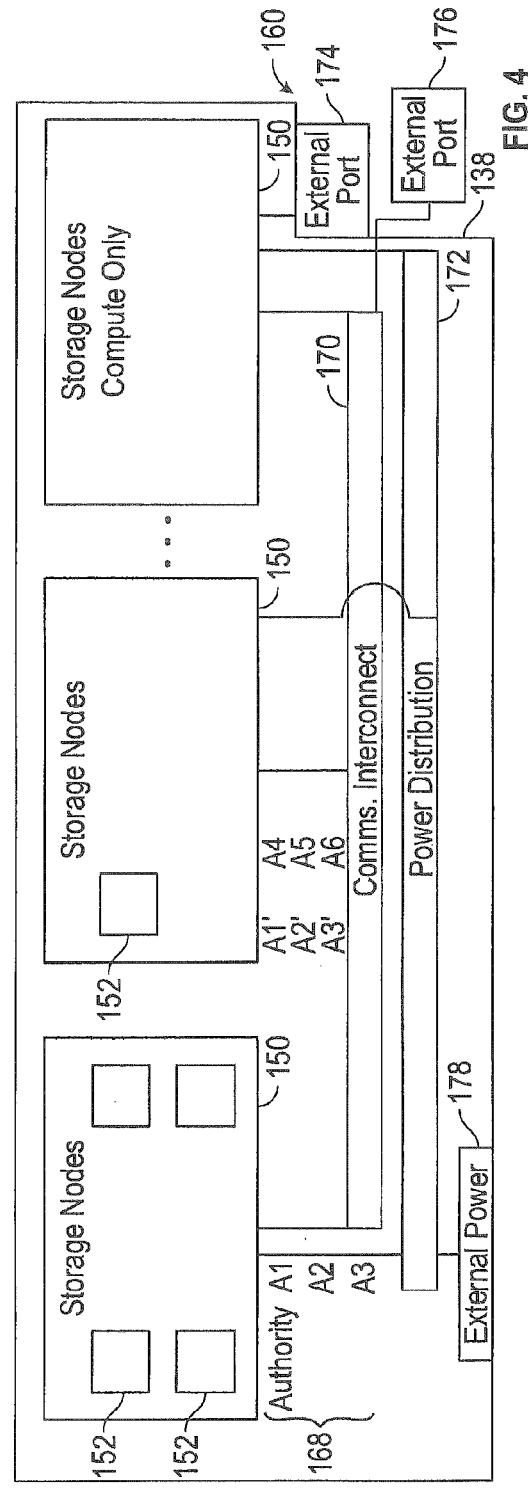
FIG. 4 is a block diagram showing an interconnect switch coupling multiple storage nodes in accordance with some embodiments.

FIG. 4 is a block diagram showing a communications interconnect 170 and power distribution bus 172 coupling multiple storage nodes 150. Referring back to FIG. 1, the communications interconnect 170 can be included in or implemented with the switch fabric 146 in some embodiments. Where multiple storage clusters 160 occupy a rack, the communications interconnect 170 can be included in or implemented with a top of rack switch, in some embodiments. As illustrated in FIG. 4, storage cluster 160 is enclosed within a single chassis 138. External port 176 is coupled to storage nodes 150 through communications interconnect 170, while external port 174 is coupled directly to a storage node. External power port 178 is coupled to power distribution bus 172. Storage nodes 150 may include varying amounts and differing capacities of non-volatile solid state storage 152 as described with reference to FIG. 3. In addition, one or more storage nodes 150 may be a compute only storage node as illustrated in FIG. 4. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 1-4, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIG. 5) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top is the directory entries (file names) which link to an inode. Modes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudorandomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being replicated. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 5:
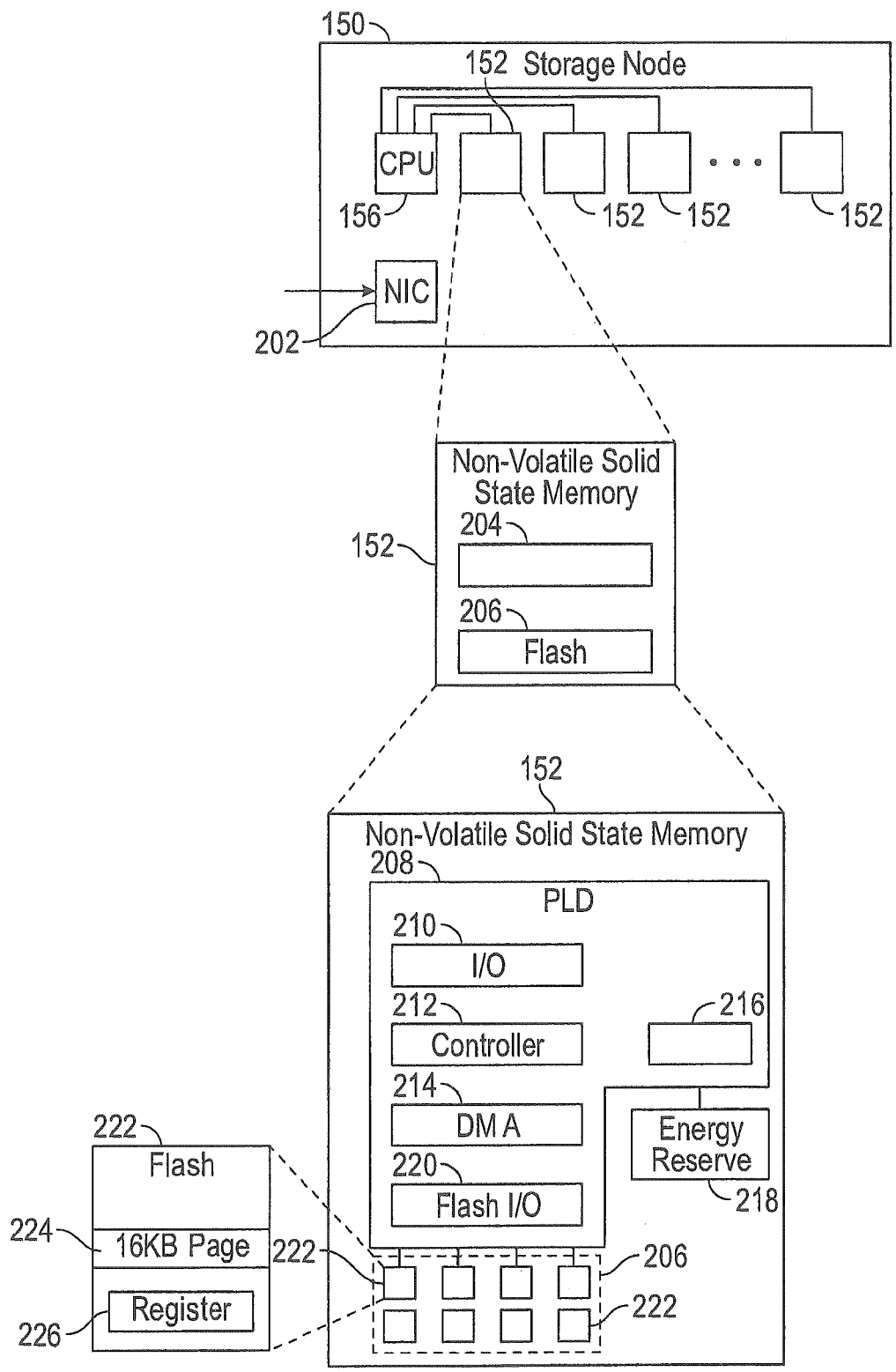
FIG. 5 is a multiple level block diagram, showing contents of a storage node and contents of one of the non-volatile solid state storage units in accordance with some embodiments.

FIG. 5 is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 5, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 5, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Figure 6:
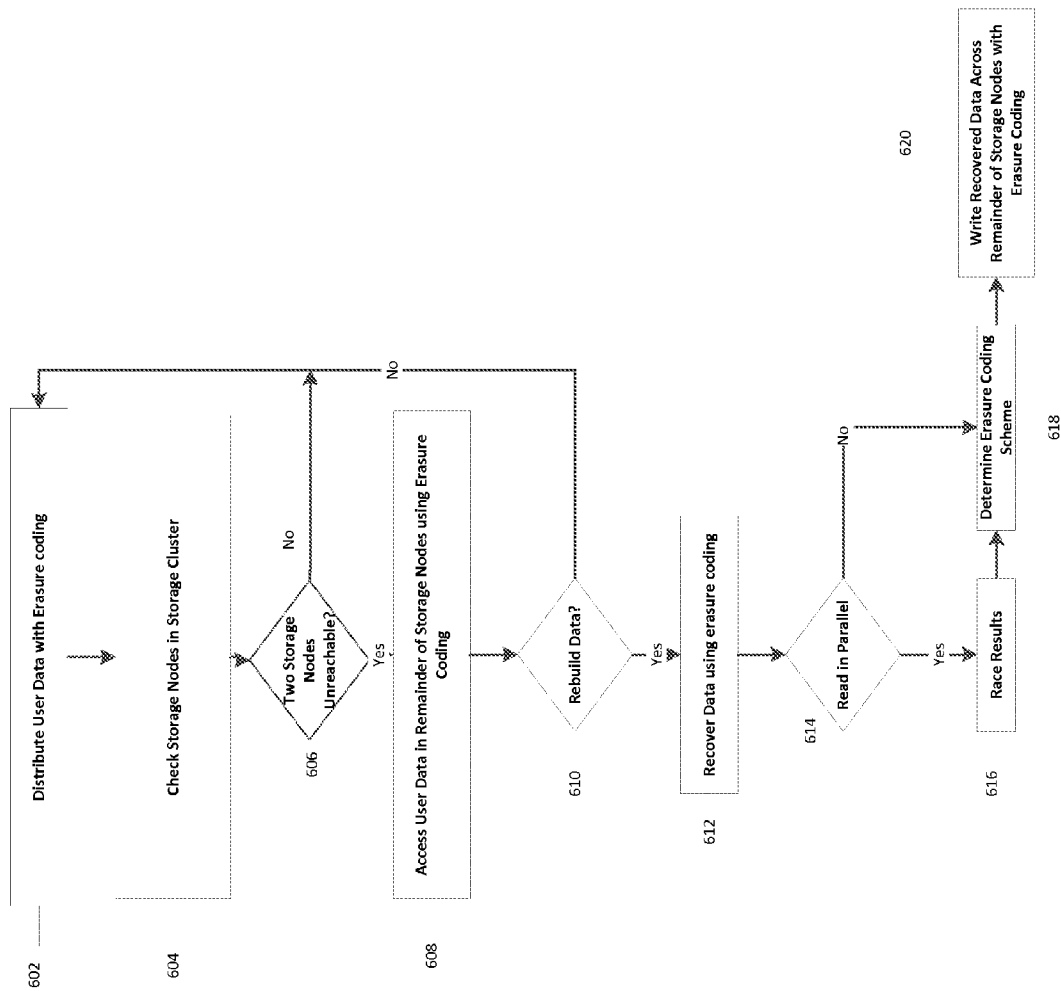
FIG. 6 is a flow diagram of a method for operating a storage cluster, which can be practiced on or by embodiments of the storage cluster, storage nodes and/or non-volatile solid state storages in accordance with some embodiments.

FIG. 6 is a flow diagram for a method of operating a storage cluster. The method can be practiced on or by various embodiments of a storage cluster and storage nodes as described herein. Various steps of the method can be performed by a processor, such as a processor in a storage cluster or a processor in a storage node. Portions or all of the method can be implemented in software, hardware, firmware or combinations thereof. The method initiates with action 602, where user data is distributed with erasure coding. For example, the user data could be distributed across the storage nodes of a storage cluster using one or more erasure coding schemes. Two erasure coding schemes (or more, in some embodiments) can coexist in the storage nodes in the storage cluster. In some embodiments, each storage node can determine which of a plurality of erasure coding schemes to apply when writing data, and can determine which erasure coding scheme to apply when reading data. These can be the same or differing erasure coding schemes.

The method proceeds to action 604 where the storage nodes in the storage cluster are checked. In some embodiments the storage nodes are checked for a heartbeat where each storage node periodically issues a message which acts as the heartbeat. In alternative embodiments the checking is in the form of querying a storage node, and the lack of response to the query indicates that the storage node is failing. In a decision action 606, it is determined if two storage nodes are unreachable. For example, if two of the storage nodes are no longer issuing heartbeats, or two of the storage nodes fail to respond to queries, or some combination of these or other indications, one of the other storage nodes could determine that two of the storage nodes are unreachable. If this is not the situation, flow branches back to the action 602, in order to continue distributing user data, e.g., writing user data into the storage nodes as the user data arrives for storage. If it is determined that two of the storage nodes are unreachable, flow continues to action 608.

In decision action 608, the user data is accessed in the remainder of the storage nodes, using erasure coding. It should be appreciated that user data refers to data originating from one or more users or client systems or other sources external to the storage cluster in some embodiments. In some embodiments erasure coding types include double redundancy, in which case, with two failed storage nodes, a remaining storage node has readable user data. Erasure coding types could include error correcting code allowing loss of two bits out of a code word, with data distributed across storage nodes so that the data can be recovered despite loss of two of the storage nodes. In a decision action 610, it is determined if the data is to be rebuilt. If the data should not be rebuilt, flow branches back to the action 602, in order to continue distributing user data with erasure coding. If the data should be rebuilt, flow branches to the action 612. In some embodiments, the decision to rebuild the data occurs after two storage nodes are unreachable, although the decision to rebuild the data may occur after one storage node is unreachable is other embodiments. Various mechanisms that could be taken into account in the decision to rebuild the data include error correction counts, error correction rates, failures of reads, failures of writes, loss of heartbeat, failure to reply to queries, and so on. Appropriate modification to the method of FIG. 6 is readily understood for these and further embodiments.

In the action 612, the data is recovered using erasure coding. This could be according to examples of erasure coding as discussed above, regarding the action 608. More specifically, the data is recovered from the remaining storage nodes, e.g., using error correcting code or reading from a remaining storage node, as appropriate. Data could be recovered using two or more types of erasure coding, in cases where these two or more types of erasure coding coexist in the storage nodes. In a decision action 614, it is determine if the data should be read in parallel. In some embodiments, there is more than one data path (e.g., as with double redundancy of data), and the data could be read in parallel across two paths. If the data is not to be read in parallel, flow branches to the action 618. If the data is to be read in parallel, flow branches to the action 616, in which the results are raced. The winner of the race is then used as the recovered data.

In an action 618, the erasure coding scheme for rebuilding is determined. For example, in some embodiments each storage node can decide which of two or more erasure coding schemes to apply when writing the data across the storage units. In some embodiments, the storage nodes cooperate to determine the erasure coding scheme. This can be done by determining which storage node has responsibility for the erasure coding scheme for a specific data segment, or by assigning a storage node to have this responsibility. In some embodiments, various mechanisms such as witnessing, voting, or decision logic, and so on, are employed to achieve this action. Non-volatile solid state storage may act as witnesses (in some embodiments) or voters (in some embodiments), so that if one copy of an authority becomes defective, the remaining functioning non-volatile solid state storage and the remaining copies of the authorities can determine the contents of the defective authority. In an action 620, the recovered data is written across the remainder of the storage nodes, with erasure coding. For example, the erasure coding scheme that is determined for the rebuilding could be different from the erasure coding scheme that is applied in recovering the data, i.e., in reading the data. More specifically, loss of two of the storage nodes may mean that some erasure coding schemes are no longer applicable to the remaining storage nodes, and the storage nodes then switch to an erasure coding scheme that is applicable to the remaining storage nodes.

Figure 7:
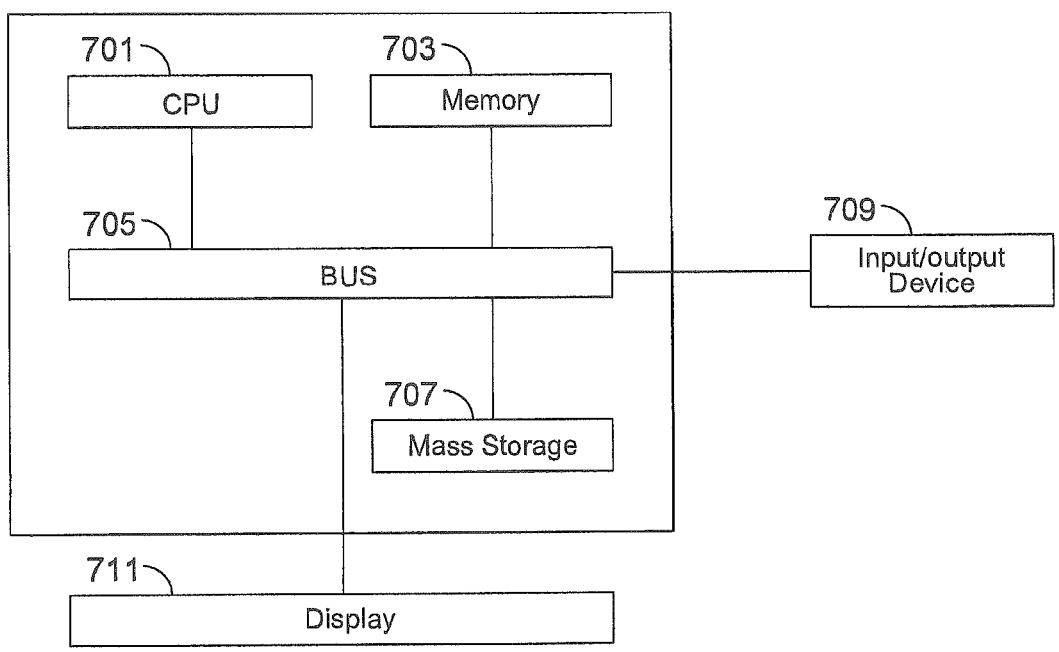
FIG. 7 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 7 is an illustration showing an exemplary computing device which may implement the embodiments described herein. The computing device of FIG. 7 may be used to perform embodiments of the functionality for a storage node or a non-volatile solid state storage in accordance with some embodiments. The computing device includes a central processing unit (CPU) 701, which is coupled through a bus 705 to a memory 703, and mass storage device 707. Mass storage device 707 represents a persistent data storage device such as a disc drive, which may be local or remote in some embodiments. The mass storage device 707 could implement a backup storage, in some embodiments. Memory 703 may include read only memory, random access memory, etc. Applications resident on the computing device may be stored on or accessed via a computer readable medium such as memory 703 or mass storage device 707 in some embodiments. Applications may also be in the form of modulated electronic signals modulated accessed via a network modem or other network interface of the computing device. It should be appreciated that CPU 701 may be embodied in a general-purpose processor, a special purpose processor, or a specially programmed logic device in some embodiments.

Display 711 is in communication with CPU 701, memory 703, and mass storage device 707, through bus 705. Display 711 is configured to display any visualization tools or reports associated with the system described herein. Input/output device 709 is coupled to bus 505 in order to communicate information in command selections to CPU 701. It should be appreciated that data to and from external devices may be communicated through the input/output device 709. CPU 701 can be defined to execute the functionality described herein to enable the functionality described with reference to FIGS. 1-6. The code embodying this functionality may be stored within memory 703 or mass storage device 707 for execution by a processor such as CPU 701 in some embodiments. The operating system on the computing device may be MS-WINDOWS™, UNIX™, LINUX™, iOS™, CentOS™, Android™, Redhat Linux™, z/OS™, or other known operating systems. It should be appreciated that the embodiments described herein may be integrated with virtualized computing system also.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

The invention claimed is:

1. A plurality of storage nodes in a single chassis, comprising:
   the plurality of storage nodes configured to communicate together as a storage cluster;
   each of the plurality of storage nodes having nonvolatile solid-state memory for user data storage; and
   the plurality of storage nodes configured to distribute the user data and metadata associated with the user data throughout the plurality of storage nodes such that the plurality of storage nodes maintain ability to read the user data, using erasure coding despite a loss of one of the plurality of storage nodes, wherein the single chassis is rack mountable and the single chassis includes internal power distribution to the plurality of storage nodes and an internal communication bus coupling the plurality of storage nodes.

2. The plurality of storage nodes of claim 1, further comprising:
the plurality of storage nodes configured to recover and rebuild the user data, responsive to a loss of one of the plurality of storage nodes.

3. The plurality of storage nodes of claim 1, wherein the single chassis couples the plurality of storage nodes to an external communication bus.

4. The plurality of storage nodes of claim 1, wherein the nonvolatile solid-state memory includes an array of flash memory.

5. The plurality of storage nodes of claim 4, wherein the non-volatile solid-state memory comprises:
a controller;
volatile memory coupled to the controller;
an energy reserve coupled to the volatile memory, wherein the non-volatile solid-state memory transfers data within the volatile memory to the array of flash memory upon detection of power loss.

6. The plurality of storage nodes of claim 1, wherein each of the plurality of storage nodes is configured to monitor and reply to a query, wherein a lack of response to the query is indicative of one of the plurality of storage nodes failing.

7. The plurality of storage nodes of claim 1, wherein the single chassis includes a plurality of slots, each slot of the plurality of slots configured to accommodate one storage node of the plurality of storage nodes.

8. The plurality of storage nodes of claim 1, wherein the plurality of storage nodes is configured to rebuild data without waiting until data is needed for a read access initiated from a client system.

9. The plurality of storage nodes of claim 1, wherein each of the plurality of storage nodes is hot pluggable.

10. The plurality of storage nodes of claim 1, wherein the plurality of storage nodes is configured to recognize insertion or removal of a storage node and to reconfigure responsive to the insertion or the removal.

11. A storage cluster, comprising:
a plurality of storage nodes within a single chassis, the single chassis comprising:
a communication bus providing communication between the plurality of storage nodes; and
a power distribution system providing power to the plurality of storage nodes;
each of the plurality of storage nodes having nonvolatile solid-state memory for storage of user data; and
the plurality of storage nodes configured to distribute the user data and metadata associated with the user data throughout the plurality of storage nodes such that the plurality of storage nodes can access the user data, via erasure coding, with a failure of one of the plurality of storage nodes.

12. The storage cluster of claim 11, further comprising:
the plurality of storage nodes configured to read data written according to a first erasure coding scheme across the plurality of storage nodes; and
the plurality of storage nodes configured to read data written according to a second erasure coding scheme across the plurality of storage nodes, wherein the data written according to the first erasure coding scheme coexists with the data written according to the second erasure coding scheme, in the plurality of storage nodes.

13. The storage cluster of claim 11, wherein the plurality of storage nodes comprises storage nodes have differing capacities of non-volatile solid state memory.

14. The storage cluster of claim 11, wherein each storage node of the plurality of storage nodes includes a printed circuit board having a processor coupled to a flash memory array.

15. The storage cluster of claim 11, wherein the single chassis includes a plurality of slots, each slot of the plurality of slots configured to accommodate one storage node of the plurality of storage nodes.

16. The storage cluster of claim 11, further comprising:
each of the plurality of storage nodes having a controller, volatile memory, and an energy reserve, the controller configured to transfer contents of the volatile memory to the non-volatile solid-state memory responsive to loss of electric power, the energy reserve configured to provide sufficient electrical power to the volatile memory to complete such a transfer.

17. The storage cluster of claim 11, wherein the plurality of storage nodes is configured to apply differing types of erasure coding for access to differing portions of the user data.

18. The storage cluster of claim 11, further comprising:
the plurality of storage nodes configured to recognize insertion of a storage node and to reconfigure responsive to the insertion, wherein each of the plurality of storage nodes is hot pluggable.

19. The storage cluster of claim 11, further comprising:
the plurality of storage nodes configured to recognize removal of a storage node and to reconfigure responsive to the removal, wherein each of the plurality of storage nodes is hot pluggable.

20. The storage cluster of claim 11, further comprising:
the plurality of storage nodes configured to detect the loss of the one of the plurality of storage nodes and to rebuild the user data, responsive to so detecting.

* * * * *